United States Patent [19]
Lowell et al.

[11] Patent Number: 5,907,764
[45] Date of Patent: May 25, 1999

[54] IN-LINE DETECTION AND ASSESSMENT OF NET CHARGE IN PECVD SILICON DIOXIDE (OXIDE) LAYERS

[75] Inventors: John K. Lowell, Round Rock; Fred N. Hause; Robert Dawson, both of Austin, all of Tex.

[73] Assignee: Advanced Micro Devices, Inc.

[21] Appl. No.: 08/556,310

[22] Filed: Nov. 13, 1995

[51] Int. Cl.$^6$ .................................................. H01L 21/302
[52] U.S. Cl. .................................. 438/17; 438/14; 438/18; 438/104; 257/43; 257/48; 257/618; 324/76.11
[58] Field of Search ................................. 438/14, 17, 18, 438/104; 324/76.11; 257/48, 43, 618; 205/157

[56] References Cited

PUBLICATIONS

P. Edelman, et al., "New Approach to Measuring Oxide Charge and Mobile Ion Concentration," *SPIE*, (Mar. 1994).
P. Edelman, et al., "Surface Charge Imaging in Semiconductor Wafers by Surface Photovoltage (SPV) ," *Proceedings of the Materials Research Society Meeting*, San Francisco, California (Apr. 1992).
K. Ishikawa, "Guide to Quality Control", *Asian Productivity Organization*, Chapt. 7, (1982).

*Primary Examiner*—Joseph K. McKane
*Attorney, Agent, or Firm*—Kevin L. Daffer; Conley, Rose & Tayon

[57] ABSTRACT

The present method provides for the detection and assessment of the net charge in a PECVD oxide layer deposited on a surface of a semiconductor substrate. Electrical potential differences across PECVD oxide layers on as-produced semiconductor substrates are measured. Resultant PECVD oxide charge derivative values are plotted on an control chart and compared to calculated control parameters. All measurement techniques are non-contact and non-destructive, allowing them to be performed on as-processed semiconductor substrates at any time during or following a wafer fabrication process. In a first embodiment, a contact potential difference $V_{CPD}$ between a vibrating electrode and the semiconductor substrate is measured while the semiconductor substrate beneath the vibrating electrode is subjected to a constant beam of high intensity illumination. The resultant value of $V_{CPD}$ is equal to the electrical potential difference across the PECVD oxide layer $V_{OX}$ (plus a constant). In a second embodiment, the semiconductor substrate is not illuminated during the measurement of $V_{CPD}$. A conventional SPV apparatus is used to measure the surface barrier potential $V_{SP}$ of the semiconductor substrate. Subtracting the measured value of $V_{SP}$ from the measured value of $V_{CPD}$ yields the value of $V_{OX}$ (plus a constant).

10 Claims, 5 Drawing Sheets

IN-LINE DETECTION AND ASSESSMENT OF NET CHARGE IN PECVD SILICON DIOXIDE (OXIDE) LAYERS

BACKGROUND OF THE INVENTION

1. Field of the Invention

This invention relates to integrated circuit manufacturing and more particularly to a method of determining the presence of electrically charged ionic contaminants within a PECVD silicon dioxide (oxide) layer deposited on a semiconductor substrate.

2. Description of the Relevant Art

Plasma-enhanced chemical vapor deposition (PECVD) techniques are often used to deposit layers of electrically insulating materials between layers of conducting traces called interconnects. Interconnects are patterned from layers of electrically conductive materials (e.g., aluminum, doped polysilicon, etc.) formed on the surface of a silicon substrate. Substantially coplanar interconnects formed on one layer must be electrically separated from interconnects of other layers. Electrical separation is achieved by placing an electrically insulating material (i.e., interlevel dielectric layer) between the vertically spaced interconnect layers. Several layers of interconnects may therefore be separated by interlevel dielectric layers. Interconnects at different elevational levels may be electrically connected by contacts formed in holes etched through the interlevel dielectric layers. Multiple layers (or levels) of interconnects allow a substantial increase in the density of devices formed on a semiconductor substrate. Common interlevel dielectric materials include silicon dioxide (oxide) and silicon nitride.

During PECVD deposition, a glow discharge (i.e., a plasma) is formed when radio frequency (RF) power is applied between two electrodes in a reaction chamber. Reactant gases contained in the reaction chamber produce chemically reactive species (atoms, ions, and radicals). These reactive species diffuse to an exposed surface of a target material, and are adsorbed on that surface. Chemical reactions occur on the exposed surface, resulting in the formation of a layer of desired material on the exposed surface of the target material.

The presence of electrically charged ions within dielectric layers of metal oxide semiconductor (MOS) devices are known to cause device reliability problems. Ionized alkali metal atoms (e.g., $Na^+$ and $K^+$) are very mobile in oxide layers, and move through gate oxides of MOS devices under the influence of the electric fields generated between gate electrodes and substrates during device operation. Over time, mobile ions in gate oxides tend to drift to the interface between the gate oxide and the underlying substrate. Resulting changes in MOS device threshold voltage levels may become large enough to cause circuits which incorporate these MOS devices to fail to meet electrical or performance requirements.

As device dimensions shrink, the influence of ionic charges in PECVD interlevel dielectric layers is being studied. Of particular interest is the influence of high concentrations of heavy metal ions (e.g., $Fe^{++}$ and $Cu^{++}$) found in PECVD dielectrics on the electrical properties of these dielectrics. While many techniques for determining the presence and concentrations of metal ions in dielectric layers currently exist, all are destructive in nature and require substantial sample preparation. These techniques include capacitance-voltage (C-V) measurements, secondary ion mass spectroscopy (SIMS), Auger emission spectroscopy (AES), and X-ray emission spectroscopy (XES).

Common (C/V) methods involve the formation of one or more MOS capacitors at test sites or on test wafers. When MOS gate structures are formed during a wafer fabrication process, MOS capacitors are also formed in test areas. MOS capacitors consist of a gate electrode formed over a gate oxide layer, the gate oxide layer being formed on a surface of a semiconductor substrate. Test areas may be on product wafers or on test wafers.

A first step in a typical C-V method involves measuring the capacitance of an MOS capacitor using high frequency alternating current (AC) stimulus while a direct current (DC) bias voltage applied between the gate electrode and the substrate is varied. The range of the applied DC bias voltage is sufficient to first deplete the surface of the substrate directly under the gate electrode of charge carriers, then attract oppositely-charged species to (i.e., invert) the surface of the substrate directly under the gate electrode. Measured capacitance values are then plotted versus corresponding values of applied DC bias, forming a first C-V curve. The MOS capacitor is then heated to about 300° C. for about 30 minutes while being subjected to a high positive DC bias applied between the gate electrode and the substrate (i.e., bias-temperature treatment). The bias-temperature treatment causes mobile ionic charges to drift to the interface between the gate oxide and the underlying substrate. The MOS capacitor is then cooled to room temperature with the positive bias still applied. The capacitance of the MOS capacitor is again measured using high frequency AC stimulus while a DC bias voltage applied between the gate electrode and the substrate is varied. The measured capacitance values are plotted versus corresponding values of applied DC bias as a second C-V curve on the same graph as the first C-V curve. Any horizontal shift between the first and second C-V curves is directly proportional to number of mobile ionic charges in the oxide.

C-V methods depend on the ability to cause highly mobile ions in a dielectric layer to move within the dielectric, creating a change in bias voltage levels required to first deplete and then invert the surface of the substrate directly under the gate electrode. Heavy metal ions commonly found in PECVD dielectric layers such as $Fe^{++}$ and $Cu^{++}$ are not highly mobile. C-V techniques would thus be ineffective in detecting the presence of heavy metal ions in relatively thick PECVD dielectric layers.

Quantitative analytical methods such as secondary ion mass spectroscopy (SIMS), Auger emission spectroscopy (AES), and X-ray emission spectroscopy (XES) are surface analysis techniques. The depth profiling required for determining the concentrations of heavy metal ions in a sample thus requires repetition of the steps of surface analysis followed by removal of a thin layer of material at the upper surface of the sample. These techniques are very time consuming and are destructive in nature, requiring expendable samples. Such tests cannot be routinely performed economically, nor can they be performed directly on manufactured products.

A new non-contact technique for detecting the presence of mobile ions in an oxide layer involves a bias-temperature treatment similar to C-V methods. In this case, however, an electric field is created by depositing corona charge (positive or negative) on the upper surface of an oxide layer. A subsequent heating step induces mobile ions drift as in C-V methods. Measurements of contact potential difference between the semiconductor substrate and the material of a probe electrode positioned immediately above the oxide layer are made using a vibrating Kelvin probe. A change of contact potential difference before and after mobile ion drift indicates the presence of mobile ions in the oxide layer. To ensure any injection of charge into the oxide layer from the substrate or the extraction of charge from the oxide layer into the substrate during testing does not go undetected, measurements of the surface barrier potential of the semiconductor substrate before and after mobile ion drift are made using a surface photovoltage (SPV) technique. See, P. Edelman, et al., "New Approach to Measuring Oxide Charge and Mobile Ion Concentration," SPIE, March, 1994 (herein incorporated by reference).

Although the new contact potential difference technique described above is non-contact, the new technique is not suitable for detecting the presence of heavy metal ions in PECVD oxide layers of manufactured products. As with common C-V methods, the new contact potential difference method depends on the ability to cause highly mobile ions in a dielectric layer to move under the influence of an electric field. Since heavy metal ions commonly found in PECVD dielectric layers such as $Fe^{++}$ and $Cu^{++}$ are not highly mobile, the new contact potential difference technique would be ineffective in detecting the presence of heavy metal ions in relatively thick PECVD dielectric layers. In addition, manufactured products may be damaged or contaminated during the deposition of corona charge and the subsequent heating step.

It would thus be desirable to have a method of detecting the presence of heavy metal ionic contaminants in a PECVD oxide layer of a manufactured product.

SUMMARY OF THE INVENTION

The problems outlined above are in large part solved by a method of detecting and assessing the net charge in a PECVD oxide layer deposited on a surface of a semiconductor substrate. In a first embodiment, a vibrating electrode of a Kelvin probe is suspended immediately above a PECVD oxide layer on a surface of a semiconductor substrate. The contact potential difference $V_{CPD}$ between the vibrating electrode and the semiconductor substrate is measured while the semiconductor substrate is subjected to a constant beam of high intensity illumination passed through the vibrating electrode and PECVD oxide layer. The resulting value of $V_{CPD}$ is equal to the electrical potential difference across the PECVD oxide layer, $V_{OX}$, plus a constant. Measured values of $V_{OX}$ (plus a constant) may be used to assess the net charge in PECVD oxide layers.

In a second embodiment, the semiconductor substrate is not illuminated during the measurement of $V_{CPD}$. A conventional surface photovoltage (SPV) apparatus is used to measure the surface barrier potential $V_{SP}$ of the semiconductor substrate. During the measurement of $V_{SP}$, the semiconductor substrate is subjected to a train of high intensity light pulses and produces a resultant surface photovoltage. Under high intensity illumination, the measured surface photovoltage is equal to the surface barrier potential $V_{SP}$. Subtracting the measured value of $V_{SP}$ from the measured value of $V_{CPD}$ yields the value of $V_{OX}$ (plus a constant).

Statistical process control (SPC) techniques are used to monitor the net charge in PECVD oxides deposited on semiconductor substrates in a manufacturing environment. Values of $V_{OX}$ (plus a constant) on as-produced semiconductor substrates are measured and plotting on an control chart. The stability of the PECVD oxide deposition process with regard to net charge is evaluated based on an interpretation of the control chart.

The light source in both embodiments preferably includes a high-intensity GaAlAs heterostructure diode dissipating approximately 0.5 watts and emitting monochromatic light with a wavelength of about 830 nm. The energies of photons produced by such a source are greater than the bandgaps of typical semiconductor substrates. A conventional SPV apparatus modulates a continuous light beam, producing a train of light pulses. The conventional SPV apparatus preferably uses light modulation frequencies from 0 Hz to about 40.0 kHz.

All measurement techniques used are non-contact and non-destructive, allowing them to be performed on as-processed semiconductor substrates and at any time during or following a wafer fabrication process. They require no special test structures, and may also be performed relatively quickly.

BRIEF DESCRIPTION OF THE DRAWINGS

Other objects and advantages of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 1:
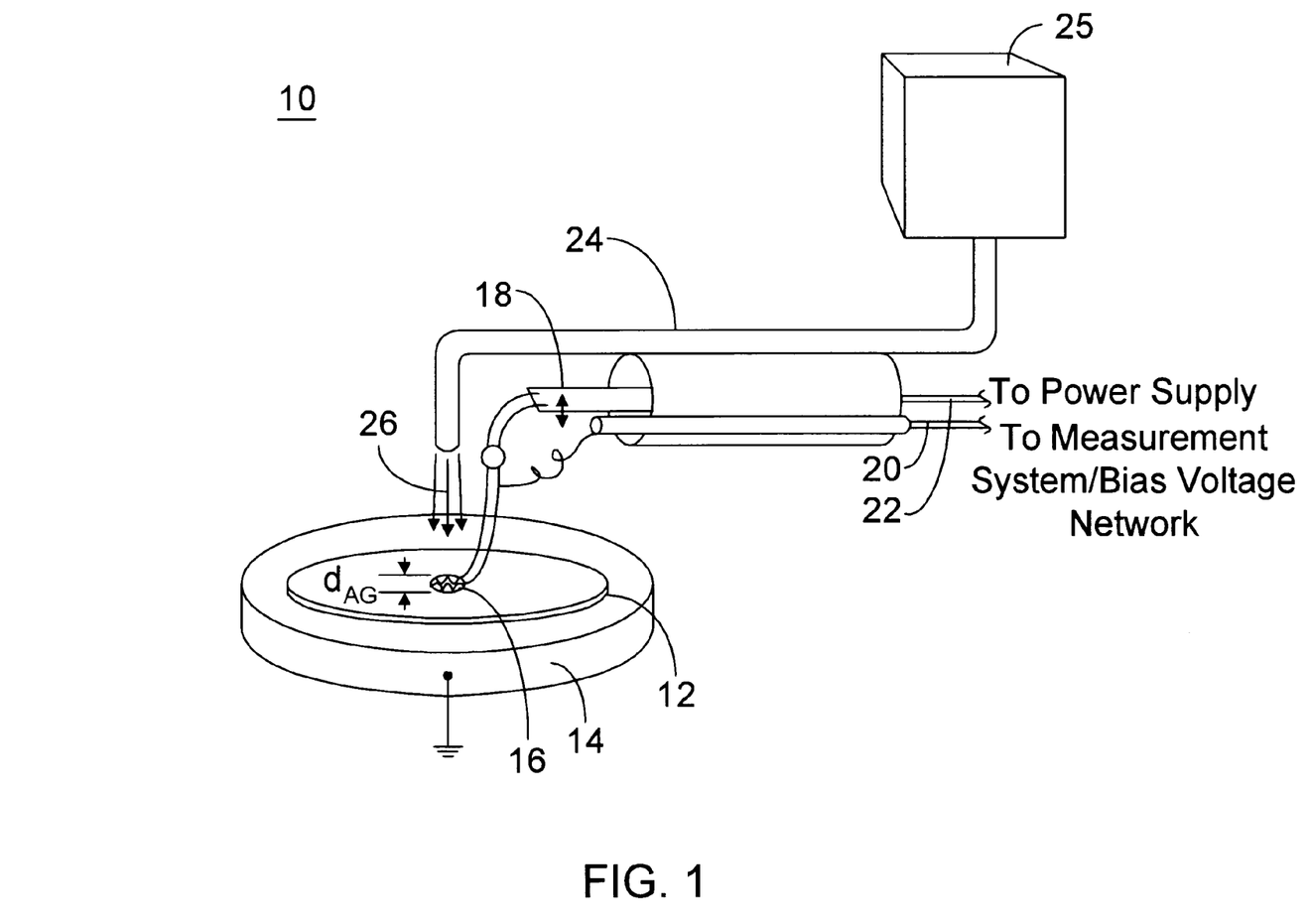
FIG. 1 is an isometric view of a probe assembly 10 capable of measuring contact potential difference between a vibrating electrode and a semiconductor substrate.

FIG. 1 is an isometric view of a probe assembly 10 capable of measuring the contact potential difference between a vibrating electrode and a semiconductor substrate. A semiconductor substrate 12 is placed upon a flat upper surface of grounded wafer chuck 14. An electrode 16 is positioned parallel to and suspended a distance $d_{AG}$ of about 1.0 mm above a PECVD oxide layer deposited upon a frontside surface of semiconductor substrate 12. Electrode 16 is mechanically coupled to a vibrating reed 18. Signal cable 20 electrically couples electrode 16 to a measurement system (not shown) and a direct current (DC) bias voltage network (not shown). Power supply cable 22 supplies electrical power to vibrating reed 18 during use. Optical cable 24 is coupled to a light source 25 and provides high intensity illumination 26 during use. Wafer chuck 14 and probe assembly 10 are able to move in relation to one another in order to allow all areas of the frontside surface of semiconductor substrate 12 to be probed.

Electrode 16 is very small, about 3.0 mm in diameter, and substantially transparent. Thus electrode 16 is preferably made of thin, loosely-woven strands of an electrically conductive material. Suitable materials for electrode 16 include gold and platinum.

Figure 2:
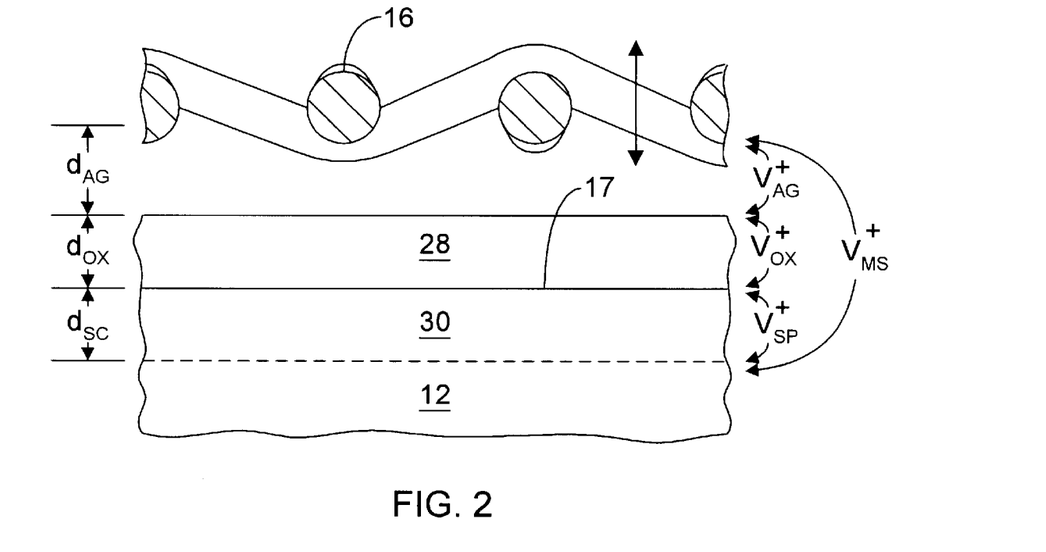
FIG. 2 is a partial cross-sectional view of the vibrating electrode and the semiconductor substrate.

FIG. 2 is a partial cross-sectional view of semiconductor substrate 12 and electrode 16. A frontside surface 17 of semiconductor substrate 12 has an PECVD oxide layer 28 formed thereupon. The thicknesses of typical PECVD oxide layers ($d_{OX}$) range from 1,000 to 5,000 angstroms. Electrical charges exist within PECVD oxide layer 28. The net electrical charge in PECVD oxide layer 28 is neutralized by an equal and opposite net charge in a space charge region 30 of semiconductor substrate 12. Space charge region 30 exists in semiconductor substrate 12 from frontside surface 17 to a depth $d_{SC}$ of about 80 to 100 angstroms. The difference in electrical potential between electrode 16 and semiconductor substrate 12 ($V_{MS}$) is given by:

$$V_{MS} = V_{AG} + V_{OX} + V_{SP} + c$$

where $V_{AG}$ is the potential difference across the air gap separating electrode 16 and PECVD oxide layer 28, $V_{OX}$ is the potential difference across PECVD oxide layer 28, $V_{SP}$ is the potential difference across space charge region 30 (i.e., the surface barrier potential) of semiconductor substrate 12, and c is a constant which depends on the difference in the work functions of electrode 16 and semiconductor substrate 12. The value of $V_{OX}$ is directly related to the net electrical charge in PECVD oxide layer 28. The work function of a material is the energy necessary to remove an electron from an atom of the material. A contact potential difference exists between any two conducting solids with different work functions.

During use, power is applied to vibrating reed 18 via power supply cable 22, causing vibrating reed 18 to vibrate sinusoidally at a frequency of about 100 Hz. Mechanically coupled to vibrating reed 18, electrode 16 also vibrates sinusoidally at a frequency of about 100 Hz. Electrode 16 thus moves alternately closer and farther away from the frontside surface of silicon substrate 12. When electrode 16 is closest to the frontside surface, distance $d_{AG}$ is about 0.5 mm. When electrode 16 is farthest away from the frontside surface, distance $d_{AG}$ is about 1.5 mm.

Figure 3:
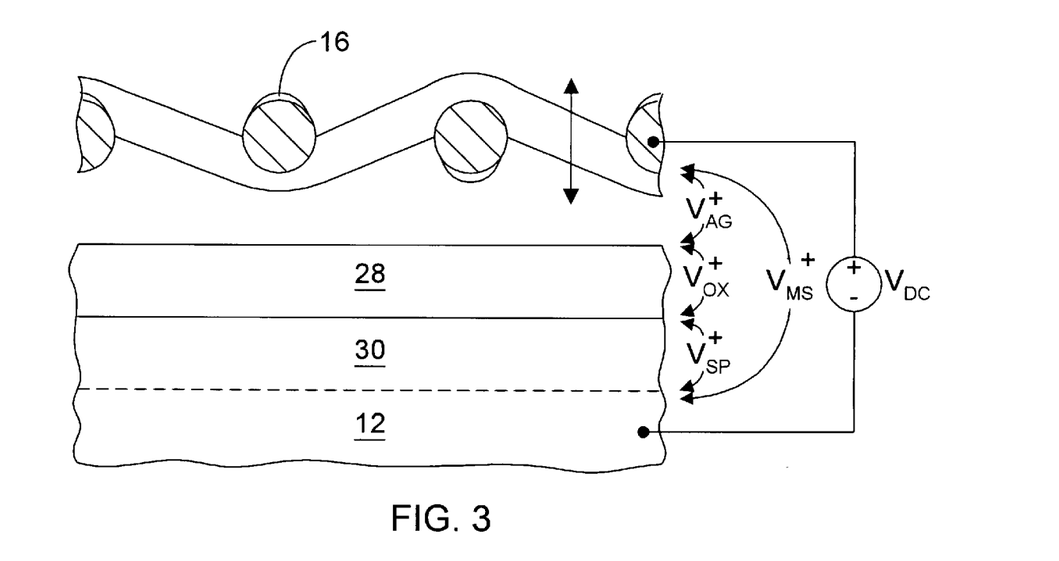
FIG. 3 is a partial cross-sectional view of the vibrating electrode and the semiconductor substrate with a direct current (DC) potential established between the vibrating electrode and the semiconductor substrate.

When electrode 16 is vibrating, the distance between electrode 16 and semiconductor substrate 12 varies sinusoidally. The capacitance between two parallel conducting plates varies inversely with the distance between them. Any electrical potential difference between vibrating electrode 16 and semiconductor substrate 12 creates a sinusoidal electrical voltage between the two conductors moving in relation to one another. In FIG. 1, a direct current voltage $V_{DC}$ applied between electrode 16 and silicon substrate 12 by the DC bias voltage network (not shown) via signal cable 20 results in the configuration shown in FIG. 3:

$$V_{DC} = V_{MS} = V_{AG} + V_{OX} + V_{SP} + c$$

As described in P. Edelman, et al., "New Approach to Measuring Oxide Charge and Mobile Ion Concentration," (referenced above), adjusting the magnitude of $V_{DC}$ to a value which results in a zero potential difference across the air gap separating electrode 16 and PECVD oxide layer 28 causes the amplitude of the sinusoidal electrical voltage developed between vibrating electrode 16 and semiconductor substrate 12 to go to zero. The magnitude of $V_{DC}$ is then equal to the contact potential difference $V_{CPD}$ between electrode 16 and silicon substrate 12. When the intensity of high intensity illumination 26 is zero:

$$V_{DC} = V_{CPD} = V_{MS} = V_{OX} + V_{SP} + c$$

Figure 4:
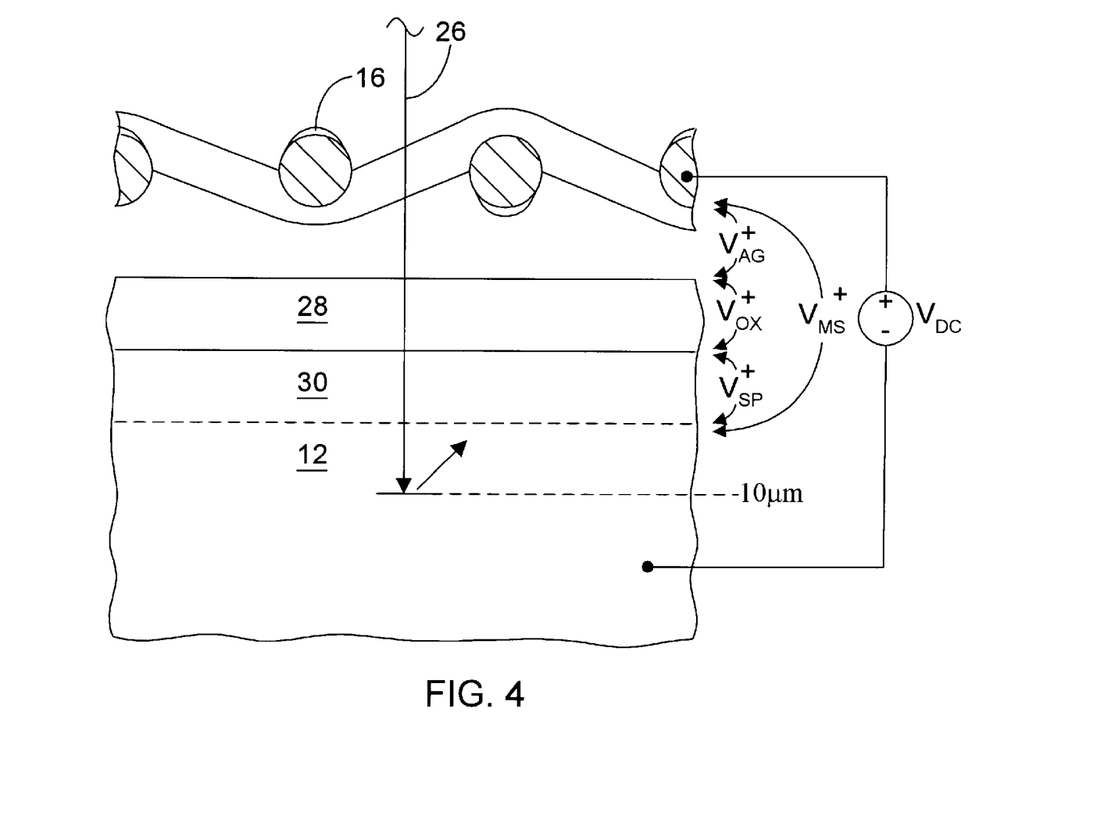
FIG. 4 is a partial cross-sectional view of the vibrating electrode and the semiconductor substrate with high intensity illumination passing through the vibrating electrode and the oxide layer and being absorbed in the semiconductor substrate.

When semiconductor substrate 12 is subjected to a continuous beam of high intensity illumination 26 through electrode 16 and PECVD oxide layer 28 as shown in FIG. 4, photons may penetrate semiconductor substrate 12 to a depth of about 10 $\mu$m as shown. The energies of incident photons may be absorbed at any point along the path of penetration of high intensity illumination 26. If the energies of the incident photons are greater than the bandgap energy of the material of semiconductor substrate 12, photons penetrating the semiconductor material are eventually absorbed, producing excess charge carriers (holes and electrons) within semiconductor substrate 12. These excess charge carriers diffuse to the surface of semiconductor substrate 12, where they become separated by the electric field of space charge region 30 and produce a surface photovoltage.

Under continuous illumination, the number of excess charge carriers reaches an equilibrium condition and the surface photovoltage becomes constant. High intensity illumination produces a surface photovoltage which is equal and opposite to the surface barrier potential $V_{SP}$. See, P. Edelman, et al., "Surface Charge Imaging in Semiconductor Wafers by Surface Photovoltage (SPV)," Proceedings of the Materials Research Society Meeting, San Francisco, Calif., April, 1992 (incorporated herein by reference). Thus the contribution of the surface barrier potential $V_{SP}$ is cancelled by the equal and opposite surface photovoltage produced by a continuous beam of high intensity illumination 26. The value of $V_{DC}$ applied between vibrating electrode 16 and silicon substrate 12 which causes the amplitude of the sinusoidal electrical voltage between the two conductors to go to zero changes by an amount equal to the surface barrier potential $V_{SP}$:

$$V_{DC} = V_{CPD} = V_{MS} = V_{OX} + c$$

Measurement of $V_{CPD}$ with semiconductor substrate 12 subjected to a continuous beam of high intensity illumination 26 thus results in a value equal to $V_{OX}$ (plus a constant). The value of $V_{OX}$ (plus a constant) allows detection and an assessment of the net charge in PECVD oxide layer 28.

Alternately, light source 25 and optical cable 24 may be deleted from probe assembly 10. Without high intensity illumination, probe assembly 10 may be used to measure the contact potential difference $V_{CPD}$:

$$V_{DC} = V_{CPD} = V_{MS} = V_{OX} + V_{SP} + c$$

Figure 5:
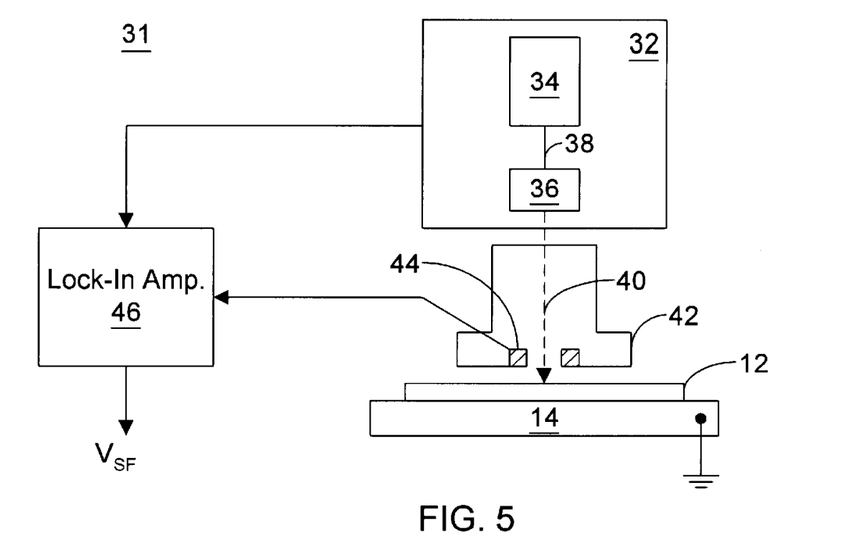
FIG. 5 is a block diagram of a conventional surface photovoltage (SPV) apparatus.

A conventional SPV apparatus 31 as shown in FIG. 5 may be used to measure surface barrier potential $V_{SP}$ of semiconductor substrate 12. SPV light source 32 includes a high intensity illumination source 34 as described above and a rotating chopper 36. Rotating chopper 34 modulates a beam of monochromatic light 38 produced by illumination source 34. SPV light source 32 thus produces a train of monochromatic light pulses 40 with constant photon flux $\Phi$. The train of monochromatic light pulses 40 passes through a housing 42 and strikes the surface of semiconductor substrate 12 resting on electrically grounded wafer chuck 14. Pickup electrode 44 sends an electrical signal reflecting the magnitude of the surface photovoltage produced by semiconductor substrate 12 to lock-in amplifier 46. Lock-in amplifier 46 is synchronized with rotating chopper 36 of SPV light source 32 via an electrical signal from SPV light source 32. Lock-in amplifier 46 provides an output signal reflecting the resultant magnitude of surface photovoltage produced by semiconductor substrate 12.

Figure 6:
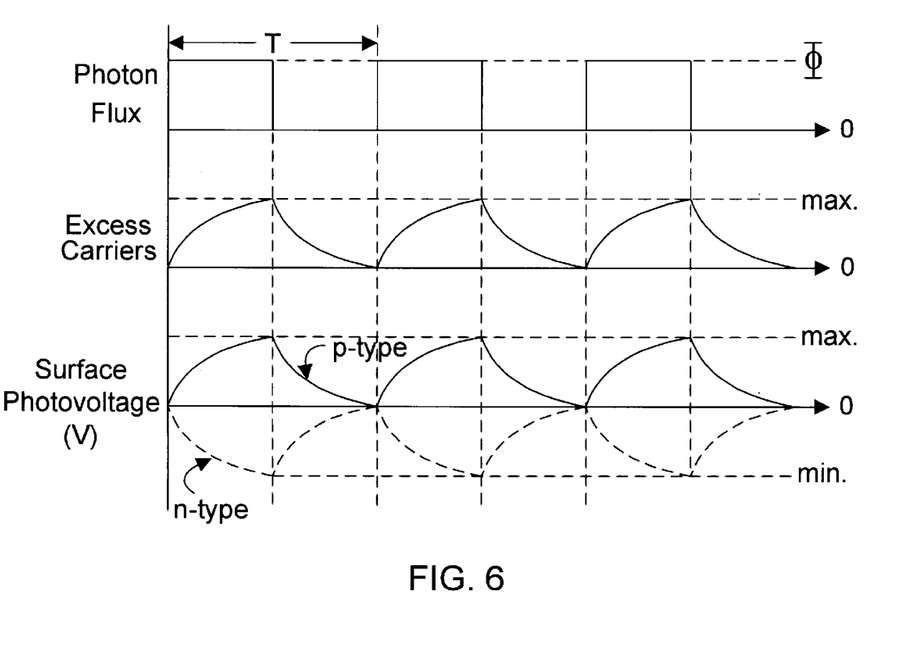
FIG. 6 is a graph of photon flux, excess charge carriers, and surface photovoltage produced during operation of the conventional SPV apparatus of FIG. 5.

As shown in FIG. 6, the train of monochromatic light pulses 40 has an associated modulation period 'T' and modulation frequency 'f', where f=1/T. It is noted that the modulation frequency 'f' of the train of monochromatic light pulses 40 is not related to the wavelength or frequency of the beam of monochromatic light 38. Light modulation frequencies from 0 Hz to about 40.0 kHz may be used to analyze the presence, indicated by charge, of mobile surface ions (from 0 Hz to about 300 Hz), interface states (from about 300 Hz to about 5.0 kHz), and near-surface recombination (from about 5.0 kHz to about 40.0 kHz).

As before, excess charge carriers diffuse to the surface of the semiconductor substrate where they become separated by the electric field of the surface space charge region and produce a surface photovoltage. In a semiconductor substrate doped with p-type material, surface photovoltage increases when an incident light pulse strikes the surface of the semiconductor substrate, and decreases when the light is blocked by rotating chopper 36 of SPV light source 32. In a semiconductor substrate doped with n-type material, surface photovoltage decreases when an incident light pulse strikes the surface of the semiconductor substrate, and increases when the light is blocked by rotating chopper 36 of SPV light source 32. The number of excess charge carriers and the surface photovoltage eventually reach an equilibrium condition. As described above, high intensity illumination produces a surface photovoltage which is equal to the surface barrier potential $V_{SP}$.

The value of $V_{SP}$ determined using conventional SPV apparatus 31 may be subtracted from the value of $V_{CPD}$ measured using probe assembly 10 to obtain the value of $V_{OX}$ (plus a constant):

$$V_{CPD} - V_{SP} = (V_{OX} + V_{SP} + c) - V_{SP} = V_{OX} + c$$

Measurement of $V_{CPD}$ using probe assembly 10 and $V_{SP}$ with conventional SPV assembly 31 thus also allows detection and assessment of the net charge in PECVD oxide layer 28.

It is noted that in the second embodiment, electrode 16 need not be substantially transparent. Thus electrode 16 may be a thin sheet of conductive material such as gold or platinum.

In a manufacturing environment, statistical process control (SPC) is commonly used to maintain control of a process and improve yields. Continuous process monitoring allows operating personnel to make necessary changes to keep a process under control. Control charts aid the process monitoring function. See, K. Ishikawa, *Guide to Quality Control*, Chapt. 7, Asian Productivity Organization, 1982 (incorporated herein by reference).

One type of control chart applicable to PECVD oxide charge assessment is an X-R control chart. An X-R control chart is actually two charts in one. In each chart, parameter values are plotted on the y (vertical) axis versus chronological sample subgroups (i.e., lots) on the x (horizontal) axis. Thus each data point on an X-R control chart represents a value for a specific sample subgroup. Each subgroup typically contains from two to five samples.

Figure 7:
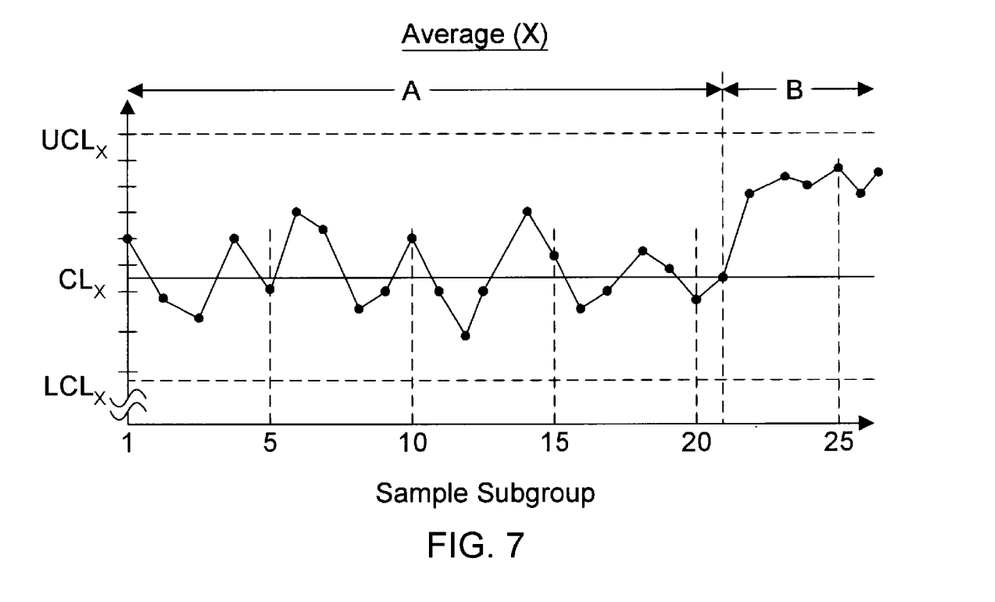
FIG. 7 is an average (X) plot of an X-R control chart.

A first average (X) chart is a graph of the average subgroup parameter values versus sample subgroup number (FIG. 7). A horizontal line through the center of the averages chart ($CL_X$) is the overall average. The overall average is computed as the sum of the averages of all subgroups divided by the number of subgroups. An upper control limit ($UCL_X$) and a lower control limit ($LCL_X$) define maximum allowable deviations from $CL_X$. As defined herein, the values of $CL_X$, $UCL_X$, and $LCL_X$ are the control parameters for an average (X) chart.

Figure 8:
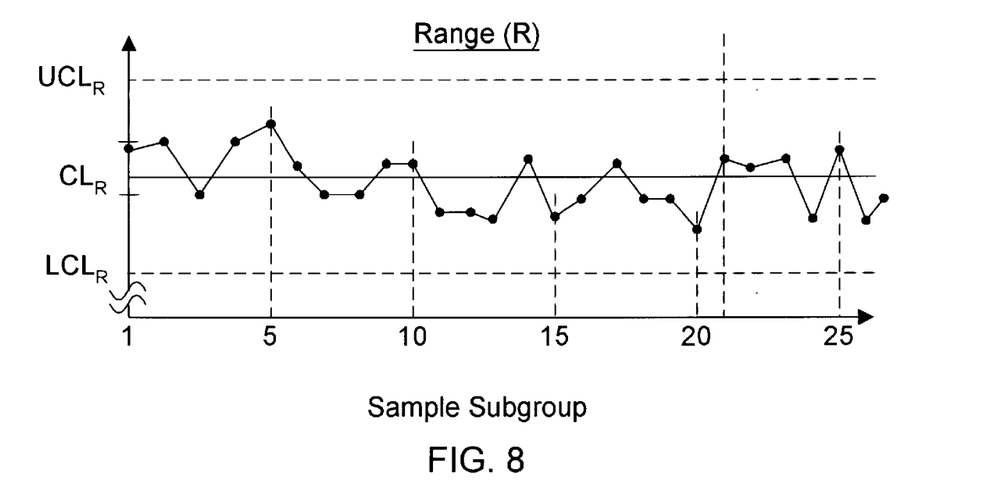
FIG. 8 is a range (R) plot of an X-R control chart.

A second range (R) chart is a graph of the largest differences between subgroup parameter values (i.e., subgroup range) versus subgroup number (FIG. 8). A horizontal line through the center of the R chart ($CL_R$) is the average of all subgroup range values. The average of all subgroup range values is computed as the sum of the range values of all subgroups divided by the number of subgroups. An upper control limit ($UCL_R$) and a lower control limit ($LCL_R$) define maximum allowable deviations from $CL_R$. As defined herein, the values of $CL_R$, $UCL_R$, and $LCL_R$ are the control parameters for a range (R) chart.

A process which is in control will have average and range values that (i) remain within the areas of the charts bounded by the UCLs and LCLs, and (ii) vary above and below $CL_X$ (average chart) and $CL_R$ (range chart) in a random pattern. In region A of FIG. 7, average and range values meet these requirements. Thus in region A of FIG. 7, the process is in control. In region B, however, the average values remain above the overall average $CL_X$, indicating that the process is out of control. The range values in region B do not exceed $UCL_R$. Thus the average values associated with subgroups have increased in region B, but the ranges associated with these subgroups have not changed appreciably from those in region A. Changes need to be made to the process to bring it back into control before $UCL_X$ is exceeded.

Measured values of $V_{OX}$ (plus a constant) may be used as PECVD oxide charge derivative values. An X-R control chart to evaluate a PECVD oxide deposition process is formed by first measuring PECVD oxide charge derivative values for a number of semiconductor substrates. The measurement data is divided into k subgroups according to measurement order. The average PECVD oxide charge derivative values are calculated for each subgroup:

$$\bar{x}_k = \frac{(x_1 + x_2 + \ldots + x_n)}{n}$$

where each subgroup contains n PECVD oxide charge derivative values and $x_n$ is the nth PECVD oxide charge derivative value in a given subgroup. The range of PECVD oxide charge derivative values for each subgroup is calculated:

$$R_k = \max(x) - \min(x)$$

where max(x) is the largest PECVD oxide charge derivative value in the kth subgroup and min(x) is the smallest PECVD oxide charge derivative value in the kth subgroup. Next the overall average of the PECVD oxide charge derivative values ($CL_X$) is calculated:

$$CL_X = \bar{\bar{x}} = \frac{(\bar{x}_1 + \bar{x}_2 + \ldots + \bar{x}_k)}{k}$$

The average of the range values of PECVD oxide charge derivative values for all subgroups ($CL_R$) is calculated:

$$CL_R = \bar{R} = \frac{(R_1 + R_2 + \ldots + R_k)}{k}$$

The UCLs and LCLs are calculated:

$$UCL_X = \bar{\bar{x}} + A_2 \bar{R}$$

$$LCL_X = \bar{\bar{x}} - A_2 \bar{R}$$

$$UCL_R = D_4 \bar{R}$$

$$LCL_R = D_3 \bar{R}$$

where the values of factors $A_2$, $D_4$, and $D_3$ may be taken from Table 1 below:

TABLE 1

| Factors for UCL and LCL Calculations | | | |
|---|---|---|---|
| n | $A_2$ | $D_4$ | $D_3$ |
| 2 | 1.880 | 3.267 | 0 |
| 3 | 1.023 | 2.575 | 0 |
| 4 | 0.729 | 2.282 | 0 |
| 5 | 0.577 | 2.115 | 0 |
| 6 | 0.483 | 2.004 | 0 |
| 7 | 0.419 | 1.924 | 0.076 |

The X-R control chart is generated using the computed values for the overall average ($CL_X$), the average of the range values ($CL_R$), and the UCLs and LCLs. The average and range values of PECVD oxide charge derivative values for each subgroup are then plotted on the X and R charts, respectively. The PECVD oxide deposition process may then be evaluated as described above with respect to net charge based upon an interpretation of the X-R control chart.

It will be appreciated to those skilled in the art having the benefit of this disclosure that this invention is believed to be capable of detecting and assessing the net charge in a PECVD oxide layer deposited on a surface of a semiconductor substrate. Furthermore, it is also to be understood that the form of the invention shown and described is to be taken as exemplary, presently preferred embodiments. Various modifications and changes may be made without departing from the spirit and scope of the invention as set forth in the claims. It is intended that the following claims be interpreted to embrace all such modifications and changes.

What is claimed is:

1. A method of determining a net charge due to heavy metal ions within a PECVD oxide layer deposited on a surface of a semiconductor substrate, comprising the steps of:
    subjecting the semiconductor substrate to a continuous beam of high intensity illumination; and
    measuring and recording a contact potential difference between the semiconductor substrate and a vibrating electrode spaced from the semiconductor substrate.

2. The method as recited in claim 1, wherein the step of measuring and recording a contact potential difference between a vibrating electrode and the semiconductor substrate comprises:
    positioning a vibrating electrode above the PECVD oxide layer, said vibrating electrode being separated from the semiconductor substrate by the PECVD oxide layer and an air gap between the PECVD oxide layer and the vibrating electrode;
    monitoring a sinusoidal electrical signal produced between the vibrating electrode and the semiconductor substrate in accordance with a sinusoidally varying distance between the vibrating electrode and the semiconductor substrate; establishing a direct current potential between the vibrating electrode and the semiconductor substrate;
    adjusting the magnitude of the direct current potential until the amplitude of the sinusoidal electrical signal produced between the vibrating electrode and the semiconductor substrate becomes zero; and
    recording a contact potential difference value measured as the direct current potential during times when the amplitude of the sinusoidal electrical signal produced between the vibrating electrode and the semiconductor substrate becomes zero.

3. The method as recited in claim 1, wherein the wavelength of the continuous beam of high intensity illumination is between 800 nanometers and 850 nanometers.

4. The method as recited in claim 3, wherein the continuous beam of high intensity illumination is produced by a GaAlAs laser diode.

5. A method of determining a net charge due to heavy metal ions within a PECVD oxide layer deposited on a surface of a semiconductor substrate, comprising the steps of:
    measuring and recording a contact potential difference between a vibrating electrode and the semiconductor substrate;
    measuring and recording a surface barrier potential of the semiconductor substrate; and
    calculating a PECVD oxide charge derivative value by subtracting the recorded value of the surface barrier potential from the recorded value of the contact potential difference.

6. The method as recited in claim 5, wherein the step of measuring and recording a contact potential difference between the vibrating electrode and the semiconductor substrate comprises:
    positioning a vibrating electrode immediately above the PECVD oxide layer, said vibrating electrode being separated from the semiconductor substrate by the PECVD oxide layer and an air gap between the PECVD oxide layer and the vibrating electrode;
    monitoring a sinusoidal electrical signal produced between the vibrating electrode and the semiconductor substrate in accordance with sinusoidally varying distance between the vibrating electrode and the semiconductor substrate;
    establishing a direct current potential between the vibrating electrode and the semiconductor substrate;
    adjusting the magnitude of the direct current potential until the amplitude of the sinusoidal electrical signal produced between the vibrating electrode and the semiconductor substrate becomes zero; and
    recording a contact potential difference between the vibrating electrode and the semiconductor substrate measured as the direct current potential during times when the amplitude of the sinusoidal electrical signal produced between the vibrating electrode and the semiconductor substrate becomes zero.

7. The method as recited in claim 5, wherein the step of measuring and recording a surface barrier potential of the semiconductor substrate comprises:

subjecting the semiconductor substrate to a train of high intensity light pulses; and recording a surface barrier potential as a measured value of resultant surface photovoltage.

8. The method as recited in claim 7, wherein the train of high intensity light pulses is produced by a GaAlAs laser diode.

9. The method as recited in claim 8, wherein the wavelength of the train of high intensity light pulses is between 800 nanometers and 850 nanometers.

10. The method as recited in claim 7, wherein the modulation frequency of the train of light pulses is from 0 hertz to about 40.0 kilohertz.

\* \* \* \* \*